United States Patent [19]
Robinson

[11] 3,936,865
[45] Feb. 3, 1976

[54] SEMICONDUCTOR DEVICES HAVING CONDUCTOR TRACKS AT DIFFERENT LEVELS AND INTERCONNECTIONS THEREBETWEEN

[75] Inventor: David Phythian Robinson, Vigo, England

[73] Assignee: U.S. Philips Corporation, New York, N.Y.

[22] Filed: Feb. 26, 1974

[21] Appl. No.: 446,103

[30] Foreign Application Priority Data
Feb. 28, 1973 United Kingdom............... 9713/73

[52] U.S. Cl. ................... 357/68; 357/53; 357/71
[51] Int. Cl.² ............... H01L 29/40; H01L 23/48; H01L 29/46
[58] Field of Search.................... 357/68, 53, 71

[56] References Cited
UNITED STATES PATENTS
3,576,668   4/1971   Fenster et al. ..................... 357/68

Primary Examiner—Stanley D. Miller, Jr.
Assistant Examiner—E. Wojciechowicz
Attorney, Agent, or Firm—Frank R. Trifari; Leon Nigohosian

[57] ABSTRACT

A semiconductor device comprising a semiconductor body comprising a first surface, a first insulating layer on said first surface of the semiconductor body, a first conductive connection layer comprising a strip portion and disposed on said first insulating layer, a second insulating layer overlying said first insulating layer and first conductive connection layer, and a second conductive connection layer situated on said second insulating layer, said second insulating layer comprising an aperture that at least partly overlies said strip portion of said first conductive connection layer and has a cross-dimension $d$ in a direction substantially at right angles to the longitudinal direction of said strip portion, a contact portion of said second conductive connection layer completely covering said aperture and contacting said strip portion of said first conductive connection layer via said aperture, wherein $x < d + 2t$ and $x$ represents the width of said strip portion and $t$ the alignment tolerance associated with the definition of said aperture with respect to said strip portion.

9 Claims, 17 Drawing Figures

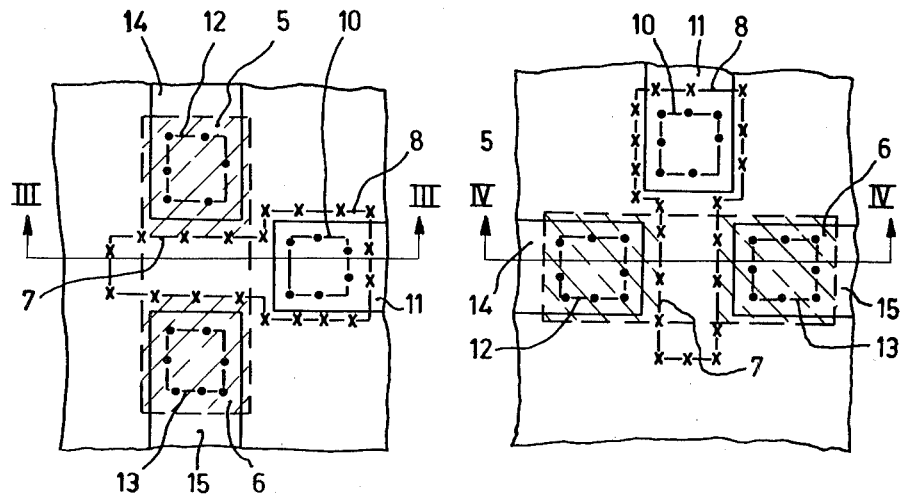
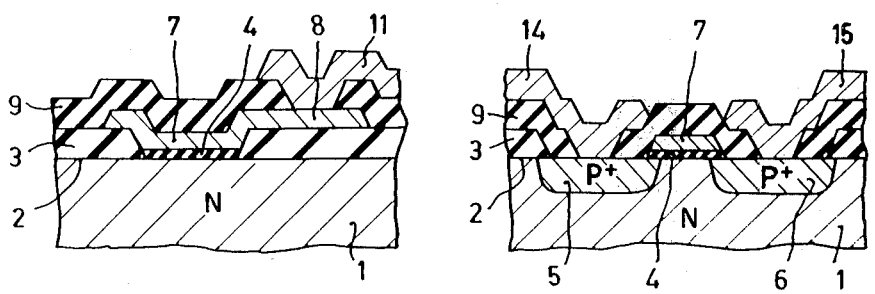
Fig.1  Fig.2
Fig.3  Fig.4

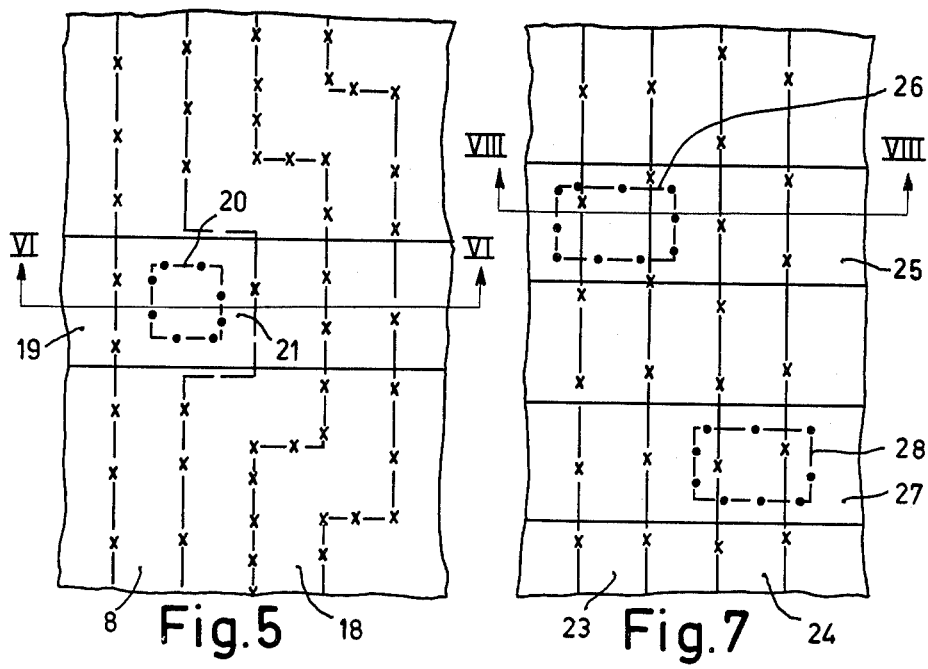
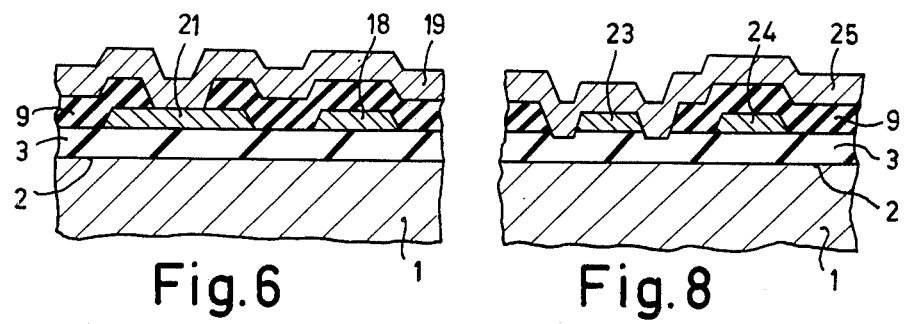
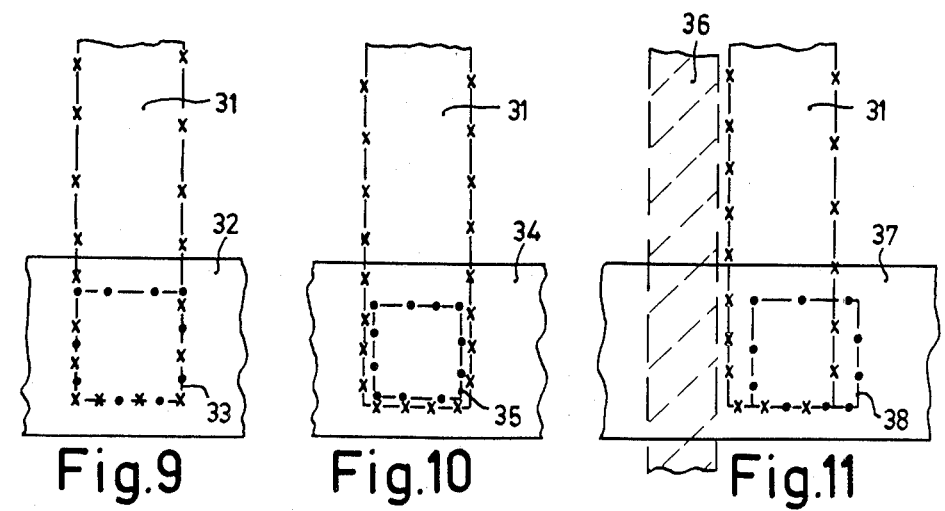

SEMICONDUCTOR DEVICES HAVING CONDUCTOR TRACKS AT DIFFERENT LEVELS AND INTERCONNECTIONS THEREBETWEEN

This invention relates to semiconductor devices, particularly but not exclusively, semiconductor integrated circuits, said semiconductor devices comprising a semiconductor body, a first insulating layer on one surface of the semiconductor body, a first conductive connection layer on the surface of the first insulating layer, a second insulating layer overlying the first insulating layer and the first conductive connection layer, and a second conductive connection layer situated on the second insulating layer, a strip portion of the first conductive connection layer being contacted by a portion of the second conductive connection layer via an aperture present in the second insulating layer.

Examples of such semiconductor devices are semiconductor integrated circuits in which the first and second conductive connection layers form interconnection layers at first and second levels. One particular group of such integrated circuits are circuits in which the semiconductor body is of silicon and comprises a plurality of insulated gate field effect transistors, the first conductive connection layer consisting of doped polycrystalline silicon and comprising a plurality of discrete portions, parts of at least some of said discrete portions forming gate electrodes of insulated gate field effect transistors. In these circuits the doped polycrystalline silicon gate electrodes normally are formed on a thinner portion of a first insulating layer of silicon oxide and further extend on a thicker portion of the first insulating layer of silicon oxide. A second insulating layer, normally of vapour deposited silicon oxide overlies the first insulating layer of silicon oxide and the doped polycrystalline silicon layer. A second conductive connection layer, normally of aluminium, is situated on the second silicon oxide layer and has portions contacting strip portions of the doped polycrystalline silicon layer via apertures formed in the second silicon oxide layer. These apertures which are sometimes referred to as contact holes and correspond substantially to the so-called "via holes" in the case of integrated circuits having two level metallisation contact systems, are normally formed in the second silicon oxide layer by a photomasking and etching step, the definition of the polycrystalline silicon layer as discrete portions of a continuous layer applied over the surface of the first silicon layer also having been achieved with the aid of a photomasking and etching step. As it is desired to include as many circuit elements per unit of surface area of the semiconductor body, commonly referred to as the packing density, as is possible to achieve within the limitations dictated by state of the art processing technology, the layout of the circuit is such that the strip portions of the doped polycrystalline silicon layer ideally have a relatively small width and close spacing. However this small width and close spacing necessitates further design features to be included when considering the fact that the strip portions have to be contacted by the aluminium layer via apertures in the second silicon oxide layer. This is because in the photomasking used for defining the apertures, departures from complete mask alignmenr may occur and this has to be taken into account in the design of the mask to be used in this photomasking step. The maximum distance by which a linear edge of an aperture in the second insulating layer may deviate from the desired location above the strip portion of the polycrystalline silicon layer, said deviation being measured in a direction at right angles to the linear edge and resulting from incomplete mask alignment, is referred to as the alignment tolerance. It will be appreciated in the mask design other factors have to be allowed for when choosing the position and size of an aperture in the second insulating layer with respect to the strip portion of the polycrystalline silicon layer, for example, whether any allowance has to be made for the resultant aperture having larger or smaller dimensions than those present in the mask, said changes in dimensions being a result, for example, of lateral etching effects and shadow effects in the photomasking step. Thus, as it is the practice to locate an aperture in the second insulating layer centrally disposed over the respective strip portion of the doped polycrystalline silicon layer, for an aperture of rectangular outline to be so situated the minimum width of the strip portion that is permissible at the area of the aperture is the width of the aperture plus two times the alignment tolerance. This therefore places a restriction on the minimum width of a strip portion due to the fact that there will always exist a minimum size for an aperture which can be obtained reproducibly. To overcome this problem the practice has been to provide a local widening of the strip portion of the polycrystalline silicon layer at the are at which an aperture is to be formed in the overlying second silicon oxide layer. However this gives rise to problems when it is desired to obtain the maximum packing density in the integrated circuit because a local widening of the strip portion of the polycrystalline silicon layer occupies a significant area and also influences the spacing and lay-out of an adjacent strip portion of the polycrystalline silicon layer or other part of a circuit element defined with the aid of a photomasking step.

According to a first aspect of the invention a semiconductor device comprises a semiconductor body, a first insulating layer on one surface of the semiconductor body, a first conductive connection layer on the surface of the first insulating layer, a second insulating layer overlying the first insulating layer and the first conductive connection layer, and a second conductive connection layer situated on the second insulating layer, a strip portion of the first conductive connection layer being contacted by a portion of the second conductive connection layer via an aperture present in the second insulating layer, said aperture at least partly overlying the strip portion of the first conductive connection layer and having a cross-dimension in a direction at right angles to the longitudinal direction of the strip portion which is at least equal to the width of the strip portion.

In this device by virtue of the aperture having the said cross-dimension, when designing the mask used in a photomasking step associated with the definition of the aperture the alignment tolerances may be neglected. The design restrictions imposed on the width of a strip portion of the first conductive connection layer in a prior art device and resulting from the necessity to account for alignment tolerances, do not occur when designing a device in accordance with the invention and this provides for a simplification in mask design and when the device is an integrated circuit a greater packing density may be achieved. The factor which allows for the aperture to be provided having the said dimension is that the second insulating layer which has to be etched to provide the aperture therein, in addition to being located on the strip portion of the first conductive connection layer is located on the first insulating layer beyond the edges of the said strip portion. Therefore provided the etching is controlled such that in the removal of an unmasked portion of the second insulating layer to define the aperture, any etching at the area beyond an edge of the strip portion is terminated on reaching the first insulating layer or before substantial etching of the first insulating layer occurs, no distinctly disadvantageous effects occur when having an aperture of the said cross-dimension.

The aperture may be of greater area than the part of strip portion lying within the aperture and have a cross-dimension in the direction at right angles to the longitudinal direction of the strip portion which is greater than the width of the strip portion, said aperture extending beyond the strip portion at each of the two longitudinal edges thereof.

In another form from the aperture has a cross-dimension in the direction at right angles to the longitudinal direction of the strip portion which corresponds substantially to the width of the strip portion and extends substantially wholly above and in registration with the strip portion.

According to a second aspect of the invention a semiconductor device comprises a semiconductor body, a first insulating layer on one surface of the semiconductor body, a first conductive connection layer on the surface of the first insulating layer, a second insulating layer overlying the first insulating layer and the first conductive connection layer, and a second conductive connection layer situated on the second insulating layer, a strip portion of the first conductive connection layer being contacted by a portion of the second conductive connection layer via an aperture present in the second insulating layer, said aperture at least partly overlying the strip portion of the first conductive connection layer, the arrangement of said strip portion and the aperture being other than an arrangement in which in addition to the whole of the aperture overlying the strip portion said strip portion also has a width $x$ given by the formula $x \geq d + 2t$ where $d$ is the said cross-dimension of the aperture and $t$ is the alignment tolerance associated with the definition of the aperture with respect to the strip portion.

In this device, in common with the device in accordance with the first aspect of the invention, the alignment tolerances when designing the mask used in a photomasking step associated with the definition of the aperture may be neglected and similarly the said design restrictions as imposed on the width of a strip portion of the first conductive connection layer in a prior art device do not occur when designing this device.

A device in accordance with the second aspect of the invention may be present in various different forms. In one form the whole of the aperture overlies the strip portion and the strip portion has a width $x$ where $x < d + 2t$. This is distinguished from the described prior art devices in which the whole of the aperture overlies the strip portion and $x \geq d + 2t$ and allowance is made for the alignment tolerances. Thus, in the case where $t$ is at most 1 micron, in a preferred form of such a device the aperture is of rectangular configuration and the strip portion has a width which exceeds the cross-dimension of the aperture by at most 2 microns.

In another form of a device in accordance with the second aspect of the invention only part of the aperture overlies the strip portion.

In a specific form of a semiconductor device in accordance with the invention, the said portion of the second conductive connection layer is in the form of a strip which crosses the stip portion of the first conductive connection layer and at the crossing makes contact therewith via the aperture.

In another specific form of a semiconductor device in accordance with either aspect of the invention said portion of the second conductive layer is in the form of a strip which extends in the same longitudinal direction as the strip portion of the first conductive connection layer and makes contact therewith via the aperture. In a device of this form and in which the aperture is of greater area than the part of the strip portion of the first conductive connection layer lying within the aperture, preferably the aperture overlaps said strip portion only at the longitudinal edge(s) thereof.

In a semiconductor device in accordance with the invention, in the vicinity of the aperture in the second insulating layer the strip portion of the first conductive connection layer may be of substantially uniform width.

The semiconductor device may consist of a semiconductor integrated circuit wherein the first and second conductive connection layers form interconnection layers at first and second levels.

In one form of such an integrated circuit the semiconductor body is of silicon and the first conductive connection layer is of doped polycrystalline silicon. The second conductive connection layer may be of aluminium.

The first and second insulating layers may be of silicon oxide, at least the second insulating layer being a layer deposited from the vapour phase. In order to prevent undersirable short circuits in the case where etching used in forming the aperture in the second insulating layer proceeds beyond the second insulating layer and beyond an edge of the strip portion of the first conductive connection layer, the first insulating layer may have an appreciable thickness and in a preferred form the first and second insulating layers at least in the vicinity of the aperture may have substantially the same thickness. In another form the first insulating layer may be of a different material to the second insulating layer and of such a composition that it is not substantially attacked by an etchant used for forming the aperture in the second insulating layer, for example, the second insulating layer may be of vapour deposited silicon oxide and the first insulating layer of silicon nitride.

A preferred form of the integrated circuit comprises a plurality of insulated gate field effect transistors, the first conductive connection layer being of doped polycrystalline silicon and comprising a plurality of discrete portions, at least one of said discrete portions comprising a gate electrode of an insulated gate field effect transistor, said gate electrode extending on a thinner portion of the first insulating layer and further extending on a thicker portion of the first insulating layer as a strip portion which is contacted by a discrete portion of the second conductive connection layer via an aperture of the said cross-dimension in the second insulating layer, said second insulating layer overlying the first insulating layer and the polycrystalline silicon layer. In such a circuit an other discrete portion of the doped polycrystalline silicon layer may extend in contact with a surface portion of the semiconductor body and further extend on the thicker portion of the first insulating layer as a further strip portion which is contacted by a discrete portion of the second conductive connection layer via an aperture of the said cross-dimension in the second insulating layer.

Embodiments of the invention will now be described, by way of example, with reference to the accompanying diagrammatic drawings, in which:

FIGS. 1 and 2 are plan views in two orientations at right angles to each other of a prior art insulated gate field effect transistor having a doped polycrystalline silicon gate electrode and forming part of a semiconductor integrated circuit comprising a plurality of such transistors; and FIGS. 3 and 4 respectively are cross-sections taken along the line III—III in FIG. 1 and line IV—IV in FIG. 2;

FIG. 5 is a plan view of part of a prior art semiconductor device in the form of an integrated circuit comprising insulated gate field effect transistors having doped polycrystalline silicon gate electrodes; and FIG. 6 is a cross-section taken along the line VI—VI in FIG. 5;

FIG. 7 is a plan view of part of a semiconductor device in accordance with the invention and in the form of an integrated circuit comprising insulated gate field effect transistors having doped polycrystalline silicon gate electrodes; and FIG. 8 is a cross-section taken along the line VIII—VIII in FIG. 7;

Figure 12:
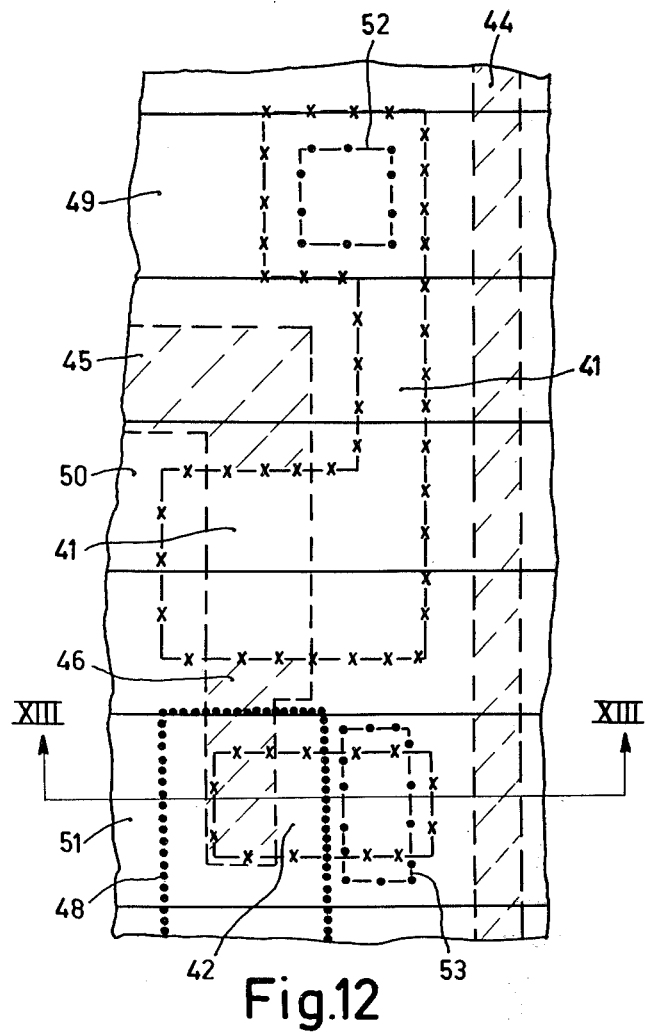
Figure 13:
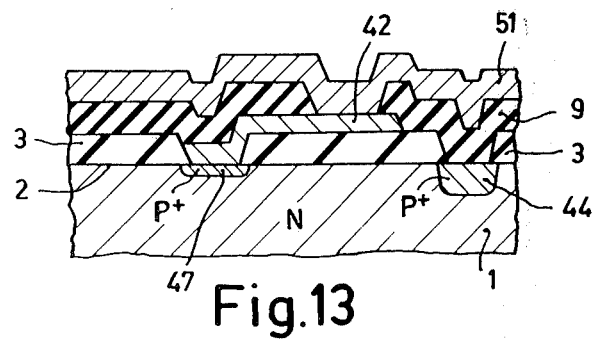
Figure 14:
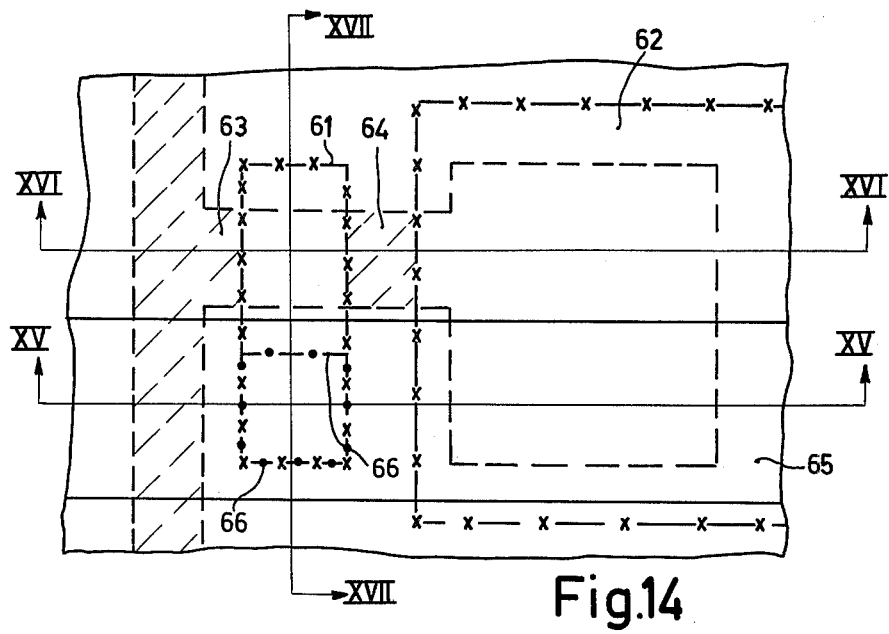
Figure 15:
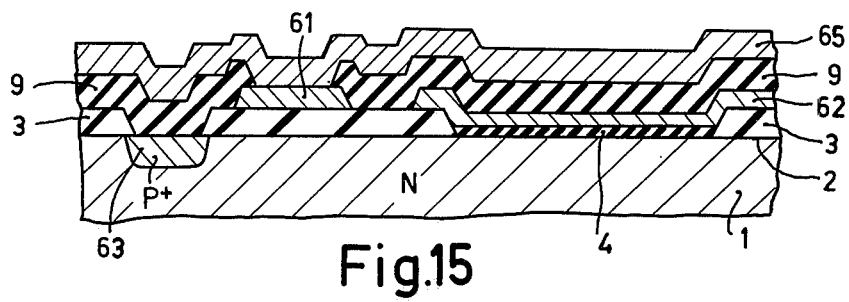
Figure 16:
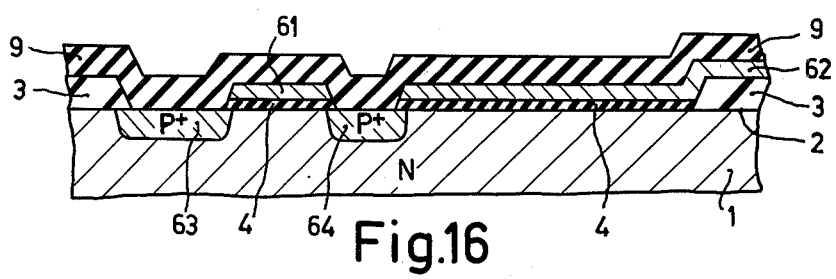
Figure 17:
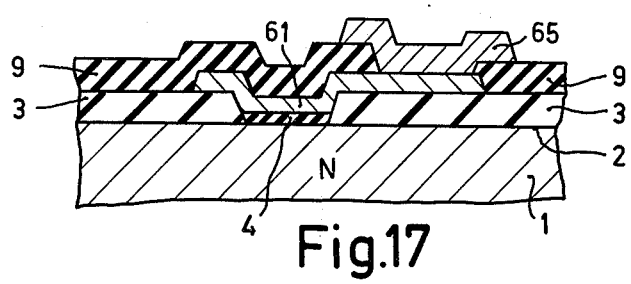

FIGS. 9, 10, and 11 show plan views of parts of further semiconductor devices in accordance with the invention;

FIG. 12 is a plan view of a part of another semiconductor device in accordance with the invention and in the form of an integrated circuit comprising insulated gate field effect transistors having doped polycrystalline silicon gate electrodes; and FIG. 13 is a cross-section taken along the line XIII—XIII in FIG. 12;

FIG. 14 is a plan view of part of another semiconductor device in accordance with the invention and in the form of an integrated circuit random access memory comprising a plurality of memory cells each having a capacitor and a single insulated gate field effect transistor having a doped polycrystalline silicon gate electrode; and FIGS. 15, 16 and 17 respectively are cross-sections taken along the lines XV—XV, XVI—XVI and XVII—XVII respectively in FIG. 14.

Referring now to FIGS. 1 to 4, the insulated gate field effect transistor comprises an n-type silicon substrate body 1 having a surface 2 on which a first insulating layer of thermally grown silicon oxide is present and consisting of a thicker portion 3 and a thinner portion 4. Diffused p$^+$-source and drain electrode regions 5 and 6 extend in the substrate 1 adjacent the surface 2 and define a current carrying channel region therebetween. The current carrying channel region is situated below the thinner portion 4 of the thermally grown silicon oxide layer and a gate electrode 7 is situated thereon. The gate electrode 7 consists of a boron doped portion of a polycrystalline silicon layer, said layer having a further portion 8 extending from the portion 7 and on the thicker portion 3 of the thermally grown silicon oxide layer.

A deposited layer 9 of silicon oxide is present overlying the thicker portion of the thermally grown silicon oxide layer and on the doped polycrystalline silicon layer 7, 8. In the deposited silicon oxide layer 9 there is a rectangular aperture 10 situated above the portion 8 of the doped polycrystalline silicon layer. An aluminium interconnection layer portion 11 extends in the aperture 10 in contact with the portion 8 of the doped polycrystalline silicon layer and further extends on the surface of the deposited silicon oxide layer 9. Further apertures 12 and 13 are present and extend through the deposited silicon oxide layer 9 to expose the p$^+$-source and drain electrode regions 5 and 6 respectively. Further portions 14 and 15 of the aluminium interconnection layer extend in the apertures 12 and 13 respectively in contact with the source and drain electrode regions 5 and 6. The portions 14 and 15 of the aluminium layer also extend on the deposited silicon oxide layer 9.

In the plan views of FIGS. 1 and 2 and in all the plan view Figures to be described hereinafter broken lines are used to indicate the initial boundary between thicker silicon oxide and thinner silicon oxide as defined in an early stage of the manufacturing process by locally removing the thicker oxide and growing thinner oxide on the silicon body portions exposed by said removal. Broken line shading within the broken lines is used to indicate the extent of removal of the thinner silicon oxide and p-type diffusion into the surface portions of the silicon body so exposed on removal of the thinner silicon oxide layer. Lines having alternately a dash and cross are used to indicate the boundary of portions of acceptor doped polycrystalline silicon, said doping having been effected by diffusion into the layer portions simultaneously with the said p-type diffusion into the silicon surface portions. Lines having alternately a dot and dash are used to indicate the boundaries of apertures in the deposited silicon oxide layer.

Referring now to FIGS. 5 and 6, there is shown in plan and cross-section respectively another part of an integrated circuit of the form including transistors as shown in FIG. 1, corresponding parts being indicated by the same reference numerals. FIG. 5 shows portions 8 and 18 of a doped polycrystalline silicon layer extending as strips on the surface of the thicker silicon oxide layer 3 and having the deposited silicon oxide layer 9 thereon. An aluminium strip 19 is situated on the deposited silicon oxide layer 9, crosses the strip portions 8 and 18 of the doped polycrystalline silicon layer, and makes contact with the portion 8 via an aperture 20 of 6 microns by 6 microns in the deposited silicon oxide layer.

In this prior art device the strip portions 8 and 18 each have a width of 6 microns and a spacing of 6 microns. However in order to obtain the contact between the strips 19 and 8 via the aperture 20, alignment tolerances have to be allowed for in the mask layout. In the present case the alignment tolerance is 3 microns, thus in the mask lay-out the sides of the aperture 20 each must be spaced by at least three microns from the adjacent edge of the portion 8 of the polycrystalline silicon layer. This necessitates an adaptation of the design for the strip 8 and the provision of a locally wider portion 21 as shown and having a total width of 12 microns as the width of the aperture 20 is 6 microns. The effect of this required local widening 21 of the strip 8 is to cause the lay-out to be such that the adjacent strip portion 18 of the polycrystalline silicon layer has to be deviated as shown to maintain the 6 micron spacing. Thus in a device comprising a large plurality of adjacently situated strip portions of a polycrystalline silicon layer such as the portions 8 and 18, the requirement for apertures such as the aperture 20 and locally wider portions such as the portion 21 causes the lay-out to be complex.

Referring now to the embodiment of a device in accordance with the invention shown in FIGS. 7 and 8, this corresponds substantially in structure to the prior art device shown in FIGS. 5 and 6 with corresponding parts being indicated by the same reference numerals, the main difference residing in the contacting of the polycrystalline silicon layer by the overlying aluminium layer. In this device the polycrystalline layer strips 23 and 24 each have a width of 6 microns and also have a separation of 6 microns. The strip 23 is contacted by an aluminium layer strip 25 of 12 microns width via a rectangular aperture 26 in the deposited silicon oxide layer 9 and the strip 24 is contacted by an aluminium layer strip 27 also of 12 microns width via a rectangular aperture 28 in the deposited silicon oxide layer 9. Each of the apertures 26 and 28 has a width of 10 microns and in the longitudinal direction of the strips 23 and 29 has a dimension of 6 microns. In the manufacture of this device the alignment tolerance associated with the step used in defining the apertures 26 and 28 is 3 microns. It will be appreciated that each of the apertures 26 and 28 having a width of 10 microns extends beyond the edges of the associated strip portion 23 and 24 respectively. However the portions of said apertures situated beyond said edges of the strip portions 23 and 24 are located over the thicker portion 3 of the thermally grown silicon oxide layer and thus the aluminium in these portions of the apertures does not cause any short circuits. With apertures 26 and 28 which in the cross-dimension at right angles to the longitudinal direction of the strips 23 and 24 exceed the width of the strips, the alignment tolerances do not have to be allowed for in the mask lay-out in so far as any deviation of the central situation of the apertures with respect to the strips is concerned. Furthermore as the distance between the edge of the strip 24 and the adjacent edge of the aperture 26 is, for the case of perfect alignment, 4 microns, and this distance is greater than the alignment tolerance of 3 microns, the lay-out is such that the spacing of the strips 23 and 24 can be maintained at 6 microns in the vicinity of the strips 23 and 24 and deviation of the strips in these areas is not necessary. This leads to an overall simplicity of the lay-out and no restrictions, arising from a necessity to provide local widenings of the polycrystalline silicon layer, are placed upon the packing density.

It will be noted that in FIG. 8 at the edges of the aperture 26 beyond the polycrystalline silicon strip 23, the thicker portion 3 of the thermally grown silicon oxide has been locally removed over a small thickness. This is due to the fact that the etching of the deposited silicon oxide layer 9 has to be carried out for a sufficient time to compensate for local variations in thickness of the layer 9.

In each of the embodiments shown in FIGS. 9, 10 and 11 a polycrystalline strip 31 has a width of 9 microns and is of the form as shown in FIG. 7 extending on a thermally grown silicon oxide layer and covered by a deposited silicon oxide layer.

In FIG. 9 the end of the strip 31 is contacted by an aluminium strip 32 of 15 microns width via an aperture of 9 microns × 9 microns situated directly overlying the end of the strip 31. In the lay-out of this device, the alignment tolerance need not be accounted for as a suitably located aperture will be formed eve.: if the aperture overlaps an edge of the strip 31.

In FIG. 10 the end of the strip 31 (9 microns width) is contacted by an aluminium strip 34 of 14 microns width via an aperture 35 of 8 microns × 8 microns situated centrally with respect to the end of the strip 31. In the lay-out of this device, the alignment tolerance need not be accounted for because a suitably located aperture will be formed even if it overlaps the edge or edges of the strip 31. It will be noted that in a corresponding prior art device the maximum permissible width of the aperture is $9 - 2t$ microns where $t$ is the alignment tolerance, that is, an aperture of 7 microns width if an alignment tolerance $t$ of 1 micron could be achieved.

In the device shown in FIG. 11, the strip 31 of the doped polycrystalline silicon layer extends parallel to a $p^+$-diffused region 36 and spaced therefrom by 1 micron. In the lay-out of this particular device the design rules are such that the alignment tolerance $t_1$ associated with the masking involved in the definition of the spacing of the edge of the polycrystalline silicon layer strip 31 from the edge of the diffused region is less than the alignment tolerance $t_2$ associated with the masking involved in the definition of the spacing of the edge of the aperture 38 from the adjacent edge of the diffused region 36, for example $t_1$ and $t_2$ may be 1 micron and 3 microns respectively. In the plan view shown the polycrystalline silicon strip 31 (9 microns width) is contacted by an aluminium strip 37 of 15 microns width via an aperture 38 of 9 microns × 9 microns but displaced by a distance of 3 microns from the edge of the strip 36 and thus the aperture 38 only partly overlies the strip 31. In this embodiment the lay-out is such that although alignment tolerances have to be accounted for at the edge of the aperture 38 adjacent the strip 36, they may be disregarded at the opposite edge of the aperture in so far as this edge is located beyond the adjacent longitudinal edge of the strip 31.

Referring now to the embodiment shown in FIGS. 12 and 13, these show in plan and cross-section respectively part of a silicon gate random access memory integrated circuit. For the sake of comparison this embodiment also illustrates the contacting of one polycrystalline silicon strip by an aluminium layer in accordance with prior art practice.

In the device shown in FIGS. 12 and 13 parts corresponding to those in FIGS. 1 to 4 are indicated by the same reference numerals, that is the n-type silicon substrate 1 having a surface 2, the thicker portion 3 of the first silicon oxide layer on the surface 2 and the deposited silicon oxide layer 9. In the plan view shown in FIG. 12, there are two portions 41 and 42 of the doped polycrystalline silicon layer. A $p^+$-diffused strip region 44 is shown which forms an interconnection line between circuit elements not shown. Other $p^+$-diffused regions 45 and 46 constitute source and drain regions of an insulated gate field effect transistor of which the portion 41 of the doped polycrystalline silicon layer comprises the gate electrode. The drain region 46 is contacted by the strip portion 42 of the doped polycrystalline silicon layer and this is provided for in the processing by means of an extra processing step whereby prior to depositing the polycrystalline silicon layer on the surface of the thicker and thinner portions 3 and 4 of first silicon oxide layer (see FIGS. 1 to 4) the thinner portion 4 of the silicon oxide layer is locally removed by a photomasking and etching step. In this manner the subsequently deposited polycrystalline silicon comes into direct contact with the silicon body surface where the thinner silicon oxide is removed and the later carried out acceptor diffusion step is effective in diffusing p-type impurity through the polycrystalline silicon at the contact with the silicon body to form a shallow p-type region 47 contiguous with the drain region 46. FIG. 12 shows in a continuous line of dots the extent of the masking used for the local removal of the thinner part 4 of the thermally grown silicon oxide layer prior to the polycrystalline silicon deposition, it being appreciated that the masking involved in this step is not critical and the boundary of the masking being situated on the thicker silicon oxide layer portion 3. Three aluminium layer strips 49, 50 and 51 extend on the surface of the deposited silicon oxide layer 9. The aluminium layer strip 49 contacts the polycrystalline silicon layer part 41 via an aperture 52 in the deposited silicon oxide layer 9, The aperture 52 has cross-dimensions of 8 microns × 8 microns and, in accordance with prior art contacting practice, for locating the aperture 52 centrally on the strip 41 and allowing for an alignment tolerance of 3 microns the strip 41 has to have cross-dimensions in the vicinity of the aperture 52 of 14 microns × 14 microns.

The aluminium layer strip 51 contacts the polycrystalline silicon layer strip 42, which is of 9 microns width in the direction at right angles to the line XIII—XIII in FIG. 12, via in aperture 53 in the deposited silicon oxide layer 9. The aperture 53 has cross-dimensions of 6 microns × 13 microns and thus has a cross-dimension in a direction at right angles to the longitudinal direction of the strip 42 which is greater than the width of the strip 42. In this manner the lay-out of the contact of the aluminium layer part 51 to the polycrystalline strip 42 is simplified as alignment tolerances for the masking involved in the definition of the aperture 53 are no longer material and furthermore no local widening of the strip 42 of 9 microns width is required in the vicinity of this contact where space is restricted because of the close proximity of the p$^+$-diffused strip 44. The reason for forming the contact between the aluminium strip 51 and the p$^+$-drain region 46 via the intermediately situated doped polycrystalline layer portion 42 rather than making a direct contact between the aluminium strip 51 and the drain region 46 is that the former method enables the circuit lay-out to be simplified, the latter method of direct contacting giving rise to difficulties in the circuit lay-out due to the comparatively large area required for a contact aperture and the close proximity of other circuit elements which are not shown in FIG. 12.

The embodiment shown in FIGS. 14 to 17 is part of a silicon gate random access memory circuit. Again in this embodiment parts corresponding to those shown in FIGS. 1 to 4 are indicated by the same reference numerals. In a plan view shown in FIG. 14 there are two portions 61 and 62 of the doped polycrystalline silicon layer. The portion 61 is in the form of a strip of cross-dimensions 9 microns × 25 microns and comprises the gate electrode of an insulated gate field effect transistor having source and drain regions 63 and 64 respectively. The portion 62 of the doped polycrystalline silicon layer extends above a rectangular area of the thinner part 4 of the thermally grown silicon oxide layer where it forms one plate of an inversion layer capacitor. An aluminium layer portion in the form of a strip 65 of 15 microns width extends on the surface of the deposited silicon oxide layer 9 and contacts the polycrystalline silicon portion 61 via an aperture 66 in the layer 9. The aperture 66 is of 9 microns ×9 microns cross-dimensions and is located substantially wholly above the strip 61. The alignment tolerance in the masking involved in the definition of the aperture 66 is 3 microns and the aperture 66 has a width of 9 microns which is therefore equal to the width of the strip 61. However as the strip 61 is spaced by over 3 microns from the adjacent edge of the p$^+$-diffused region and by 6 microns from the adjacent edge of the polycrystalline region 62, any misalignment of the aperture 66 with respect to the strip 61 will still provide a suitable contact of the aluminium layer strip 65 to the polycrystalline silicon strip 61 without giving rise to short circuits. It will be appreciated that the dimensions given for the strip 61 and aperture 66 are by way of example and in a further embodiment the strip 61 may be of 6 microns width and the aperture of 6 microns × 6 microns in cross-section.

The manufacture of a device as shown in FIGS. 12 and 13 or FIG. 14 to 17 may be by methods commonly employed in the art. The etching to form the apertures in the deposited silicon oxide layer may be carried out using buffered hydrofluoric acid at 30°C which consists of 6 parts by volume of a saturated solution of ammonium fluoride and 1 part by volume of 48% hydrofluoric acid. For a silicon oxide layer deposited from silane and oxygen and of 1 micron thickness an etching time of 7 minutes is found to yield suitable apertures. Where reference is made herein to a first insulating layer having a thicker portion and a thinner portion it will be understood that such a layer may be formed in various process steps and furthermore that the thicker portion and thinner portion may differ in the manner in which they are provided.

Many modifications are possible within the scope of the invention. For example the first and second conductive connection layers may both be of metal and in certain applications may be of different metals. The integrated circuits may comprise bipolar transistors and the first and second conductive connections layers from a two-level metallisation contact system. Furthermore in an embodiment of the form shown in FIGS. 12 and 13, a further discrete portion of the doped polycrystalline silicon layer which comprises a gate electrode, that is a portion such as the portion 41, may be contacted by an aluminium strip portion situated on the deposited silicon oxide layer 9 and extending via an aperture in the layer 9 of the said cross-dimension. In this manner a portion of the doped polycrystalline silicon layer such as the portion 41 when contacted by an aluminium strip portion such as the strip portion 49 need not have the local widening as shown in FIG. 12 and thus in the vicinity of the contact aperture may be formed as a relatively narrow strip portion of substantially uniform width.

What is claimed is:

1. A semiconductor device comprising a semiconductor body comprising a first surface, a first insulating layer on said first surface of the semiconductor body, a first conductive connection layer comprising a strip portion and disposed on said first insulating layer, a second insulating layer overlying said first insulating layer and first conductive connection layer, and a second conductive connection layer situated on said second insulating layer, said second insulating layer comprising an aperture that at least partly overlies said strip portion of said first conductive connection layer and has a cross-dimension d in a direction substantially at right angles to the longitudinal direction of said strip portion, a contact portion of said second conductive connection layer completely covering said aperture and contacting said strip portion of said first conductive connection layer via said aperture, wherein $x < d + 2t$ and $x$ represents the width of said strip portion and $t$ the alignment tolerance associated with the definition of said aperture with respect to said strip portion.

2. A semiconductor device as in claim 1, wherein the cross-dimension $d$ is at least equal to the width $x$ of said strip portion.

3. A semiconductor device as in claim 1, wherein the area of said aperture is greater than the part of the strip portion at said aperture.

4. A semiconductor device as in claim 3, wherein said aperture has a cross-dimension greater than the width of said strip portion and extends beyond said strip portion at each of the two longitudinal edges of the latter.

5. A semiconductor device as in claim 4, wherein the aperture overlaps said strip portion only at the longitudinal edges thereof.

6. A semiconductor device as in claim 1, wherein said contact portion comprises a strip element which crosses said strip portion of said first conductive connection layer and at the crossing therebetween contacts said strip portion via said aperture.

7. A semiconductor device as in claim 1, wherein said contact portion comprises a strip which extends substantially in the same longitudinal direction as said strip portion of the first conductive connection layer and makes contact therewith via the aperture.

8. A semiconductor device as in claim 1, wherein at least in the vicinity of said aperture said strip portion is of substantially uniform width.

9. A semiconductor device as in claim 1, wherein said first and second insulating layers at least in the vicinity of the aperture have substantially the same thickness.

* * * * *